United States Patent [19]
Takahashi et al.

[11] Patent Number: 6,075,263
[45] Date of Patent: Jun. 13, 2000

[54] METHOD OF EVALUATING THE SURFACE STATE AND THE INTERFACE TRAP OF A SEMICONDUCTOR

[75] Inventors: Yuji Takahashi; Yasuo Ohno, both of Tokyo, Japan

[73] Assignee: NEC Corporation, Tokyo, Japan

[21] Appl. No.: 09/057,180

[22] Filed: Apr. 8, 1998

[30] Foreign Application Priority Data

Apr. 9, 1997 [JP] Japan .................................. 9-090825

[51] Int. Cl.⁷ .......................... H01L 29/78; H01L 33/00
[52] U.S. Cl. .......................................................... 257/284
[58] Field of Search .............................. 257/284; 324/691

[56] References Cited

U.S. PATENT DOCUMENTS

| | | |
|---|---|---|
| 3,836,993 | 9/1974 | Joshi . |
| 4,709,251 | 11/1987 | Suzuki . |
| 4,939,557 | 7/1990 | Pao et al. . |

FOREIGN PATENT DOCUMENTS

| | | | |
|---|---|---|---|
| 6344775 | 2/1988 | Japan | H01L 29/80 |
| 276234 | 3/1990 | Japan | H01L 21/336 |
| 364039 | 3/1991 | Japan | H01L 21/66 |
| 3132052 | 6/1991 | Japan | H01L 21/66 |
| 3241758 | 10/1991 | Japan | H01L 21/66 |
| 4280438 | 10/1992 | Japan | H01L 21/338 |

OTHER PUBLICATIONS

"An analytical model for frequency–dependent drain conductance in HJFET's" Kunihiro et al Inst. Phys. Conf. Ser. No. 136; Chapter 2; 1993; pp. 3–8.

*Primary Examiner*—Stephen D. Meier
*Attorney, Agent, or Firm*—Hayes, Soloway, Hennessey, Grossman & Hage PC

[57] ABSTRACT

A method of evaluating the surface/interface of a semiconductor device is disclosed. This method uses the semiconductor device in which an n-type source electrode and an n-type drain electrode are formed on both ends of the surface of an n-type conductive layer formed on a semiconductor substrate; and a gate electrode composed of a p-type ohmic electrode or an n-type Schottky electrode is formed on one end of the surface on which the source or drain electrode is not disposed. In this semiconductor device, voltage to be applied to the gate electrode is changed and a change of current flowing between the source electrode and the drain electrode in response to the voltage change is measured. Then the type of trap on the surface/interface of the semiconductor is determined from an amount of change in the value of the current.

3 Claims, 6 Drawing Sheets

METHOD OF EVALUATING THE SURFACE STATE AND THE INTERFACE TRAP OF A SEMICONDUCTOR

BACKGROUND OF THE INVENTION

1. Field of the Invention

The present invention relates to a semiconductor device for evaluating the surface and the interface of a semiconductor and a method of evaluating the surface and the interface of a semiconductor by the use of the semiconductor device.

2. Description of the Related Art

In a semiconductor device such as a field effect transistor (hereinafter referred to as FET), the trap of the surface and the interface of a semiconductor (hereinafter referred to as a surface state/interface trap) and the presence of ions placed on the surface cause a problem of a trap response such as a frequency dispersion. The surface state/interface trap and the presence of ions are also important factors for determining basic properties such as a breakdown voltage of the semiconductor device. Frequency dispersion herein means a phenomenon in which a current is changed due to the frequency of an alternating voltage applied to the semiconductor device. However, the actual surface state/interface trap is changed in accordance with the method of fabricating the semiconductor device and in accordance with the material being in contact with the interface. During fabricating the semiconductor device, it is thus difficult to strictly control the energy level of the trap and the concentration of the ions placed on the surface.

The ions placed on the surface during and after fabricating the semiconductor device acts as an interface charge, so that it has an influence on the operation of a FET. The ions are thus difficult to completely remove. It is therefore necessary to evaluate the fabricated semiconductor device and to obtain information about the surface state/interface trap and the ions placed on the surface.

As methods of measuring and evaluating the surface state/interface trap, the method of measuring the frequency dispersion by the use of the FET and the measuring method using DLTS (Deep Level Transient Spectroscopy)/ICTS (Isothermal Capacitance Transient Spectroscopy) have been heretofore employed. However, it is difficult to electrically measure the concentration of the ions placed on the surface.

Additionally, during a measurement of the frequency dispersion, a voltage, resulting from the alternating voltage superposed on a direct-current voltage, is applied to a drain electrode and a gate electrode of the FET. In this way, a conductance of the FET and a phase difference between the current and the voltage are detected. A change due to the frequency is then checked, whereby the presence of the trap is judged. On the other hand, using the DLTS/ICTS, method a current transient response is observed when the voltage of the drain electrode and the gate electrode of the FET is changed in a pulse manner, whereby the presence of the trap is observed.

These conventional measuring methods make use of the fact that the change in a charge state of the surface state/interface trap due to an alternating signal and pulse input causes the change in a potential distribution so as to thereby modulate the current. The measurement is performed by changing a temperature, whereby the energy level of the trap and a capture cross section can be also calculated.

However, in these methods, confirmation of the presence of the surface state/interface trap depends on a detection of a time constant. Thus, if the time constant is within a time scale in which the measurement is performed or within a frequency range, the presence of the trap can be confirmed. However, when the energy level of trap is shallow or when the response is made by the use of a time constant different from the time constant calculated from the energy level of the trap and the capture cross section, the presence of the surface state/interface trap cannot be detected or can be falsely detected.

Since the FET is often used for the measurement, the change in the voltage applied to the drain electrode and the gate electrode causes the change of the surface state/interface trap in an unintended place and the change in the charge state of the trap in a substrate. Consequently, a measurement result includes even these trap responses. Since it is difficult to separate the response alone from the target surface state/interface trap, it is difficult to specify the place of the surface state/interface trap to be observed.

Although whether the trap concentration which is one of parameters associated with a recombination rate is higher or lower can be determined from a comparison of two results, the concentration value is difficult to calculate. Thus, since the measurement result is observed only in the form of a current variation and the conductance change, it is not possible to judge the recombination rate through the surface state/interface trap.

SUMMARY OF THE INVENTION

It is an object of the present invention to provide a method of evaluating the surface/interface of a semiconductor capable of detecting the presence and type of a trap of the surface or the interface of a semiconductor.

It is another object of the present invention to provide a semiconductor device capable of measuring an electric charge of ions placed on the surface of the semiconductor and a method of evaluating the surface/interface of a semiconductor.

In order to achieve the above objects, the method of evaluating the surface/interface of a semiconductor according to the present invention uses a semiconductor device in which a source electrode and a drain electrode composed of a first conductive-type ohmic electrode are formed opposite to each other on both ends of the surface of a first conductive-type conductive layer formed on a semiconductor substrate; and a gate electrode composed of a second conductive-type ohmic electrode or a first conductive-type Schottky electrode is formed on at least one end of the surface of the conductive layer on which the source electrode or the drain electrode is not disposed.

The method comprises the steps of: changing a voltage applied to the gate electrode and measuring a change of a current flowing between the source electrode and the drain electrode in response to the change in the voltage; and determining the type of trap of the surface and the interface between the source electrode and the drain electrode in accordance with an amount of change in the current.

The present invention employs the fact that a potential of a non-depleted surface state/interface trap is shifted in a low bias direction or a high bias direction or the potential is changed in accordance with a distance to both the electrodes. The voltage applied to the gate electrode is changed so as to measure the change of the current flowing between the source electrode and the drain electrode in response to the change in the voltage, whereby the type of the trap of the surface and interface between the source electrode and the drain electrode is determined. It is therefore possible to measure the presence and type of the trap which is impossible for a conventional measuring method using a frequency dispersion and DLTS/ICTS.

Furthermore, method of evaluating the surface/interface of a semiconductor according to the present invention uses the semiconductor device in which the source electrode and the drain electrode composed of the first conductive-type ohmic electrode are formed opposite to each other on both the ends of the surface of the first conductive-type conductive layer formed on the semiconductor substrate; and the gate electrode composed of the second conductive-type ohmic electrode or the first conductive-type Schottky electrode is formed on at least one of the ends of the surface of the conductive layer on which the source electrode or the drain electrode is not disposed.

The method comprises the steps of: changing a distance between the gate electrode and a side surface of the conductive layer opposite thereto or between the one gate electrode and the other gate electrode opposite thereto and measuring the change of the current flowing between the source electrode and the drain electrode in response to the change in the distance; and measuring a recombination rate at the trap of the surface or interface of the semiconductor in accordance with a size of the distance in which the amount of change in the current is increased.

The present invention employs the fact that the recombination causes the change in the potential when the potential of the surface state/interface trap of a hole-trap type substrate, where hole-traps is compensated with shallow acceptors/donors (hereinafter referred to as HTR-substrate) or an electron-trap type substrate, where electron-traps is compensated with shallow acceptors/donors (hereinafter referred to as ETR-substrate) is equal to the potential of a gate voltage. According to the present invention, measured is the change of the current flowing between the source electrode and the drain electrode in response to the change in the distance to the end of the surface opposite to the gate electrode. The recombination rate at the trap of the surface or interface of the semiconductor is measured in accordance with the size of distance in which the amount of change in the current is increased. It is therefore possible to calculate, as the value, the recombination rate which is impossible for the conventional measuring method using the frequency dispersion and DLTS/ICTS.

Furthermore, the method of evaluating the surface/interface of a semiconductor according to the present invention uses the semiconductor device in which the source electrode and the drain electrode composed of the first conductive-type ohmic electrode are formed opposite to each other on both ends of the surface on the first conductive-type conductive layer formed on the semiconductor substrate; a first gate electrode composed of the second conductive-type ohmic electrode or the first conductive-type Schottky electrode is formed on one end of the surface of the conductive layer on which the source electrode or the drain electrode is not disposed; and a second gate electrode composed of the first conductive-type ohmic electrode or the second conductive-type Schottky electrode is formed opposite to the first gate electrode on the other end of the surface thereof.

The method comprises the steps of: applying voltages of different potentials to the first gate electrode and the second gate electrode, respectively; applying a constant voltage to the drain electrode and measuring the current flowing between the drain electrode and the source electrode; and determining a charge of ions placed on the surface of the semiconductor in accordance with the current.

According to the present invention, the voltages of different potentials are applied to the first gate electrode and the second gate electrode. A constant voltage is then applied to the drain electrode. The current flowing between the drain electrode and the source electrode is measured, whereby the charge of the ions placed on the surface of the semiconductor is determined. It is therefore possible to determine the charge of the ions placed on the surface of the semiconductor which is impossible for the conventional measuring method.

The above and other objects, features and advantages of the present invention will become apparent from the following description with reference to the accompanying drawings which illustrate examples of the present invention.

DETAILED DESCRIPTION OF THE PREFERRED EMBODIMENTS (Embodiment 1)

Figure 1:
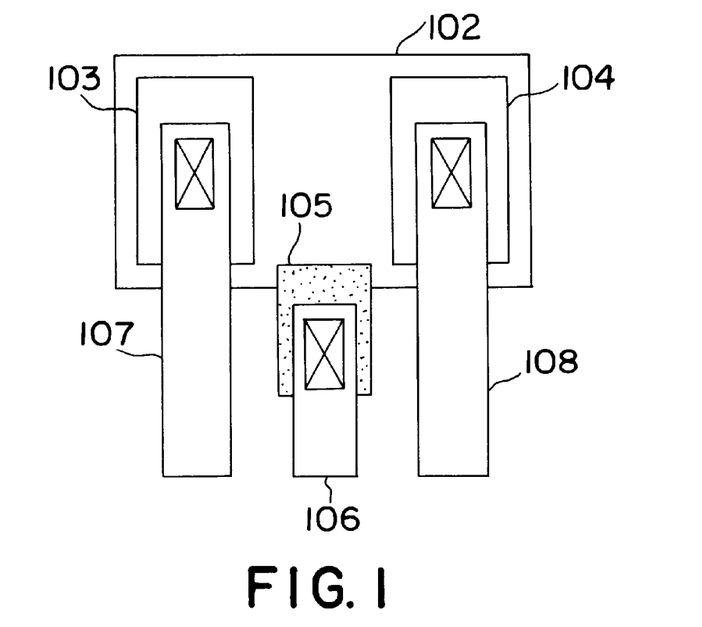
FIG. 1 is a plan view of a semiconductor device according to a first embodiment of the present invention.
Figure 2:
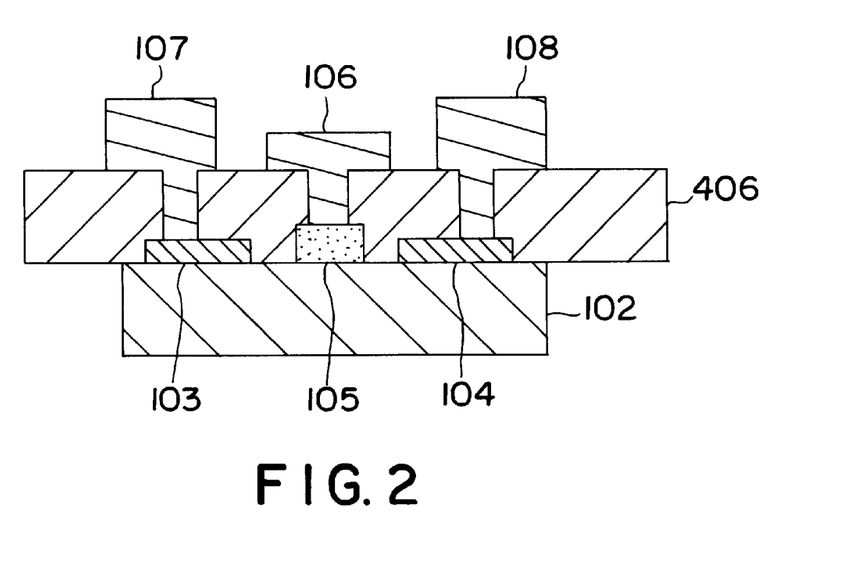
FIG. 2 is a cross sectional view of the semiconductor device shown in FIG. 1.

As shown in FIG. 1, in the semiconductor device of this embodiment, source electrode 103 and drain electrode 104 composed of an n-type ohmic electrode are formed on both ends of n-type conductive layer 102, formed on a semiconductor substrate. Gate electrode 105 composed of a p-type ohmic electrode or an n-type Schottky electrode is formed on one end of the conductive layer 102 where the source electrode 103 or drain electrode 104 is not disposed. Wiring electrodes 107, 108 and 106 are disposed on source electrode 103, drain electrode 104 and gate electrode 105, respectively. In FIG. 1, insulating film 406 in FIG. 2 is omitted in order to facilitate the description.

This embodiment illustrates a transistor such as HEMT (High Electron Mobility Transistor) and MESFET (MEtal Semiconductor FET) in which the gate electrode is disposed directly on the conductive layer.

A method of determining whether the type of trap of the surface/interface of a semiconductor is an electron-trap type or a hole-trap type will be described below by the use of this embodiment.

Figure 3:
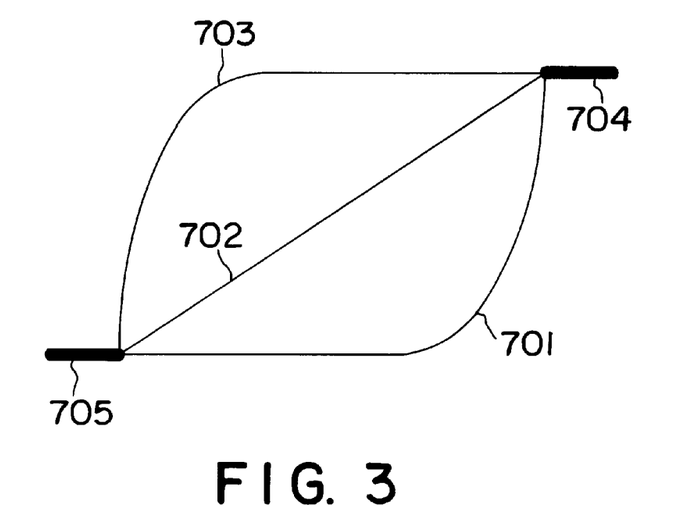
FIG. 3 shows a shape of a potential distribution in a semiconductor in accordance with a conductive type of an electrode.

This method uses a shape of a steady-state potential distribution in a semiconductor having a one-dimensional structure in which the electrodes are present on both the ends of the surface thereof and having the electron-trap or hole-trap on type surface/interface. The following description is provided for a case that the electrodes disposed on both the ends of the surface of the semiconductor are electrodes 704, 705. Initially, when 0 V and a negative bias are applied to electrode 705 and electrode 704, respectively, the shape of the potential distribution is shown in FIG. 3.

The shape of the potential distribution in the semiconductor exhibits any one of distribution shapes 701, 702, 703 in accordance with the conductive type and level type of electrodes 704 and 705 on both the ends. This is shown in Table 1.

TABLE 1

| Electrode conductive type | | Potential distribution in accordance with trap taype | |
|---|---|---|---|
| Electrode 705 | Electrode 704 | Electron-trap | Hole-trap |
| n-type ohmic electrode | n-type ohmic electrode | Distribution shape 702 | Distribution shape 703 |
| p-type ohmic electrode | n-type ohmic electrode | Distribution shape 702 | Distribution shape 702 |
| n-type ohmic electrode | p-type ohmic electrode | Distribution shape 701 | Distribution shape 703 |
| p-type ohmic electrode | p-type ohmic electrode | Distribution shape 701 | Distribution shape 702 |

Table 1 shows that electrodes 704, 705 are the ohmic electrodes. When the Schottky electrodes are used for electrodes 704, 705, the n-type Schottky electrode is equivalent to the p-type ohmic electrode and the p-type Schottky electrode is equivalent to the n-type ohmic electrode.

When one electrode is gate electrode 105 and the other electrode is drain electrode 104 or source electrode 103, a relationship shown in Table 1 can be applied to the semiconductor device of this embodiment. That is, the potential of the non-depleted surface state/interface trap is shifted in a low bias direction or a high bias direction in accordance with the conductive type of gate electrode 105, drain electrode 104 and source electrode 103 and the voltage to be applied (which voltage bias is higher), or the potential is changed in accordance with the distance to both the electrodes.

In this embodiment, conductive layer 102 is made of an n-type semiconductor. Gate electrode 105 is made of the p-type ohmic electrode or the n-type Schottky electrode. Source electrode 103 and drain electrode 104 are made of the n-type ohmic electrode. If a gate voltage is higher than a source or drain voltage, the non-depleted surface state/ interface trap has the same potential as either the gate voltage or the source or drain voltage in accordance with the trap type.

When conductive layer 102 is made of a p-type semiconductor, gate electrode 105 is made of the n-type ohmic electrode or the p-type Schottky electrode. Source electrode 103 and drain electrode 104 are made of the p-type ohmic electrode. Thus, if the gate voltage is lower than the source and drain voltages, the non-depleted surface state/ interface trap has the same potential as either the gate voltage or the source or drain voltage in accordance with the trap type.

Figure 4:
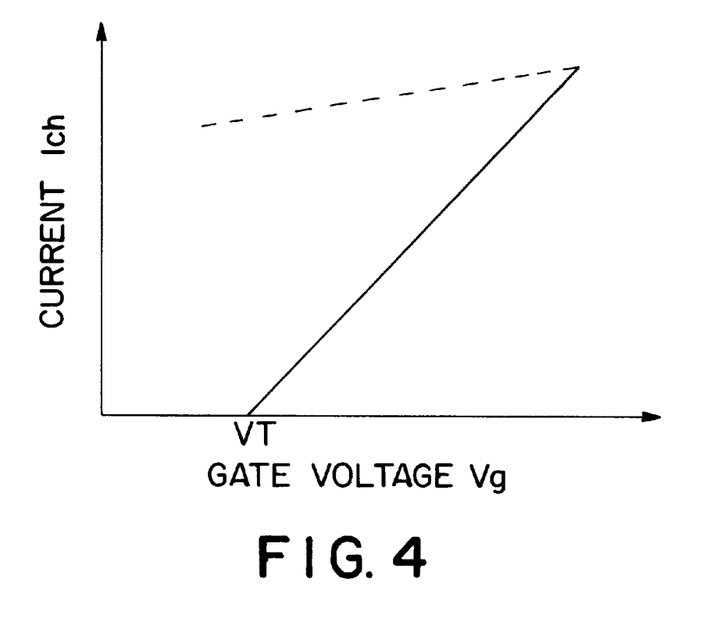
FIG. 4 is a graph showing a change of a current in accordance with a trap type.

When the surface state/interface trap has the same potential as the gate voltage, a region where the surface state/ interface trap is present behaves as if the gate electrode were present in the region. Thus, the current flowing between source electrode 103 and drain electrode 104 formed on the ends of conductive layer 102 is modulated by the gate voltage even in the region where gate electrode 105 is absent. On the other hand, when the interface/surface level has the same potential as the drain voltage or the source voltage, the region where gate electrode 105 is absent is not modulated by the gate voltage. FIG. 4 shows current Ich flowing between source electrode 103 and drain electrode 104 when both gate voltages Vg are changed. A dotted line shows the case in which a modulation is performed by the gate voltage. A solid line shows the case in which the modulation is not performed by the gate voltage. VT in FIG. 4 denotes a threshold voltage.

That is, the conductive types of source electrode 103, drain electrode 104 and gate electrode 105 are apparent at the time of fabricating the semiconductor. Thus, a direct-current voltage to be applied to gate electrode 105 is changed, whereby the change in current Ich is measured in response to the change in the voltage. If the amount of change in current Ich is a constant value or less, the surface state/interface trap can be determined to be the electron-trap type. If the amount of change is more than the constant value, the surface state/interface trap can be determined to be the hole-trap type. Thus, this method is different from the conventional measuring methods using a frequency dispersion and DLTS/ICTS in that it does not depend on a detection of time constant in confirming the presence of the surface state/interface trap. Therefore, this method can ensure that the surface state/interface trap is detected.

(Embodiment 2)

A second embodiment of the present invention will be described below with reference to FIGS. 5 and 6.

Figure 5:
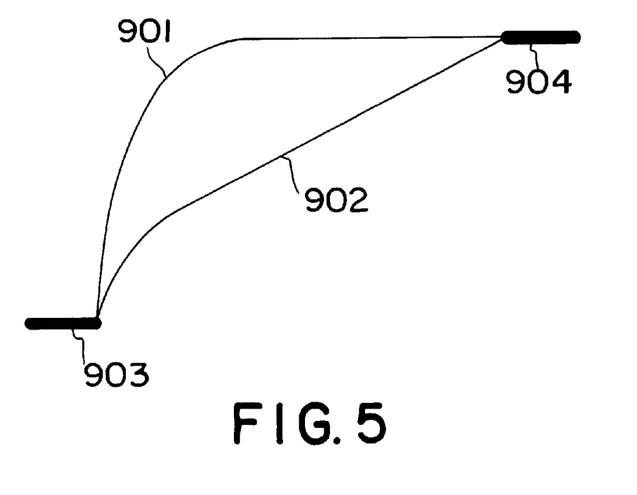
FIG. 5 is a graph showing a difference of the potential distribution in accordance with a recombination rate.

FIG. 5 is a graph showing a difference of the potential distribution in accordance with the recombination rate. FIG. 6 is a graph showing the change in current Ich when Wgopen is changed.

The recombination rate through the surface state/interface trap is dependent on a trap concentration, a capture cross section and a potential difference between the electrodes. In this embodiment, the recombination rate is measured in accordance with the trap of the surface or the interface.

In this embodiment, a plurality of semiconductor devices, each having different distance Wgopen to the end of the surface opposite to gate electrode 105, are used in the semiconductor device of FIG. 1.

This measuring method employs the fact that the recombination causes the change in the potential when the trap type of a substrate is hole-trap type or surface state/interface trap of the ETR-substrate has the potential equal to the gate voltage.

For this measurement, semiconductor device which has a short width of Wgopen is chosen, so that the potential of the surface state/interface trap may be equal to that of the gate voltage. The potential of the surface trap of this semiconductor device is equal to the potential of the gate voltage except near source electrode 103 and drain electrode 104. Wgopen is changed, by choosing another semiconductor device so that the recombination through the trap is increased in response to the distance. Thus, the potential on the surface does not coincide with the voltage of gate electrode 105. Distribution shape 901, which is the shape of the potential distribution when the recombination is absent as shown in FIG. 5, is therefore changed into distribution shape 902. As a result, an extent of the modulation by the gate voltage is reduced.

Figure 6:
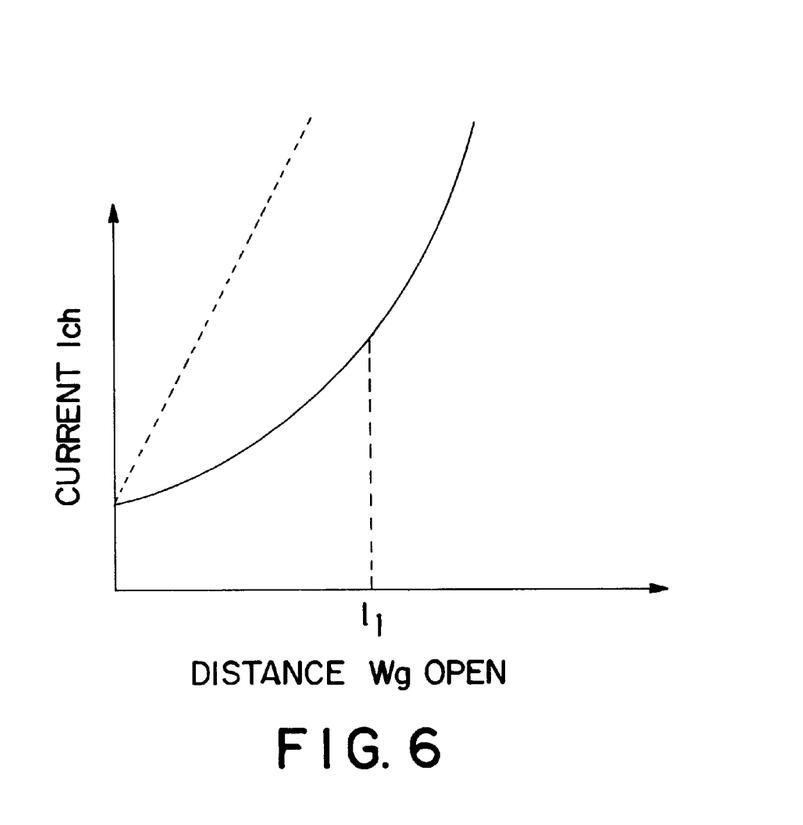
FIG. 6 is a graph showing the change of the current when Wgopen is changed.

FIG. 6 shows the change in current Ich flowing between source electrode 103 and drain electrode 104 with respect to distance Wgopen in this case. The dotted line shows the change in the current when the recombination rate is high. The solid line shows the change in the current when the recombination rate is low.

When the recombination rate is greater than a constant value, as shown by the dotted line, a steeply inclined straight line is exhibited. However, when the recombination rate is less than a constant value, as shown by the solid line, an inclination gets gradually steeper from or near distance $l_1$. When current Ich flows between drain electrode 104 and source electrode 103, distance $l_1$ at which the current is scarcely modulated by the gate voltage is determined. If the distance is longer, the recombination rate by the surface state/interface trap can be determined to be lower. If the distance is shorter, the recombination rate by the surface state/interface trap can be determined to be higher.

Figure 7:
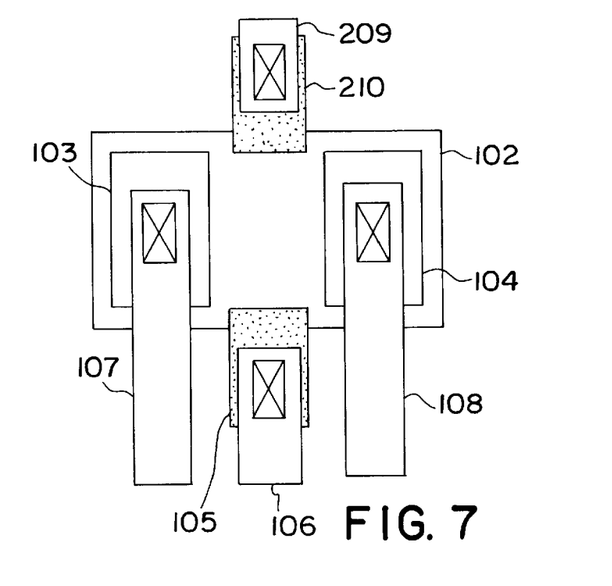
FIG. 7 is a plan view of the semiconductor device when gate electrode 210 is formed on conductive layer 102 in FIG. 1.

In the first and second embodiments, gate electrode 105 is disposed on one end of the surface on which source electrode 103 and drain electrode 104 are not located. Alternatively, as shown in FIG. 7, gate electrode 210 of the same conductive type as gate electrode 105 may be disposed opposite to gate electrode 105 on the other end of the surface on conductive layer 102 so that wiring electrode 209 may be connected to gate electrode 210. In this case, in the second embodiment, the distance between two gate electrodes 105 and 210 is set to Wgopen, whereby the recombination rate can be measured in the same manner.

In the first and second embodiments, gate electrode 105 is disposed directly on conductive layer 102. Alternatively, the present invention may be applied to the semiconductor device such as MOSFET in which the gate electrode is formed through the insulating film such as a dielectric film.

Figure 8:
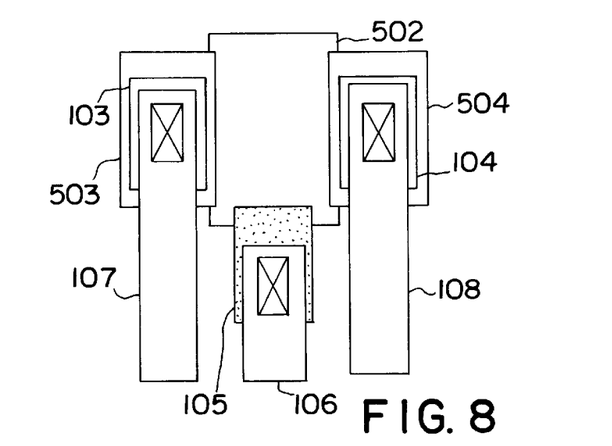
FIG. 8 is a schematic plan view of the semiconductor device when gate electrode 105 is formed through dielectric film 510.
Figure 9:
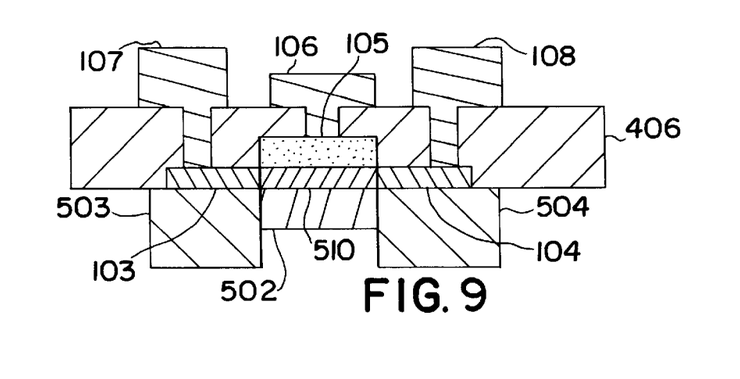
FIG. 9 is a cross sectional view of the semiconductor device shown in FIG. 8.

The semiconductor device of this structure is shown in FIGS. 8 and 9.

In this semiconductor device, n-type conductive layer 503 and n-type conductive layer 504 are formed adjacent to p-type conductive layer 502 formed on the semiconductor substrate. Gate electrode 105 composed of the p-type ohmic electrode or the n-type Schottky electrode is formed on conductive layer 502 through dielectric film 510. Source electrode 103 composed of the n-type ohmic electrode is formed on conductive layer 503. Drain electrode 104 composed of the n-type ohmic electrode is formed on conductive layer 504. Wiring electrodes 107, 108 and 106 are disposed on source electrode 103, drain electrode 104 and gate electrode 105, respectively.

Even if the two gate electrodes are formed in the same manner as the semiconductor device of FIG. 7, the gate electrodes may be formed through the dielectric film.

Figure 10:
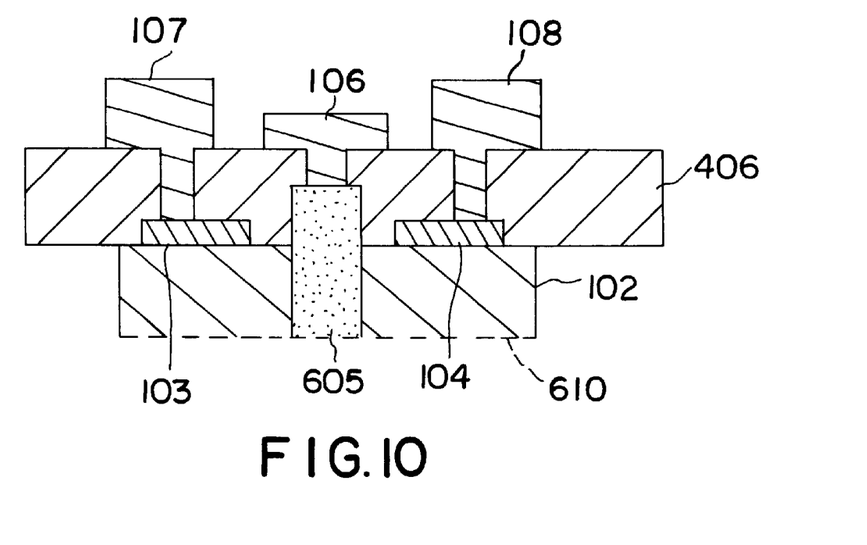
FIG. 10 is a cross sectional view of the semiconductor device when the gate electrode is extended to an interface to be measured.

In the first and second embodiments, gate electrode 105 is extended to interface 610 to be measured such as a substrate/ epitaxial layer interface so that gate electrode 605 may be formed, whereby it is possible to measure the trap of interface 610 to be measured. Such a semiconductor device is shown in FIG. 10.

(Embodiment 3)

A third embodiment of the present invention will be described below.

Figure 11:
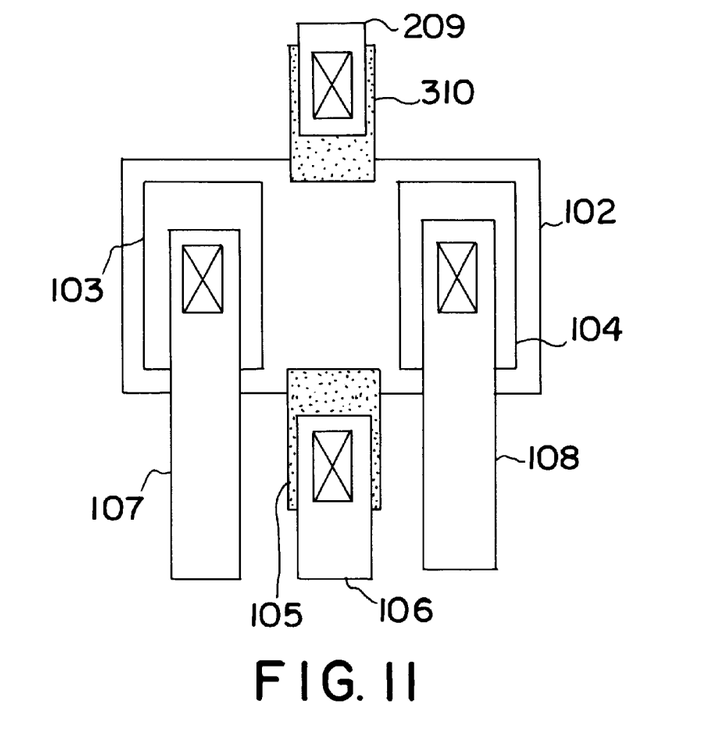
FIG. 11 is a plan view of the semiconductor device according to a third embodiment of the present invention.
Figure 12:
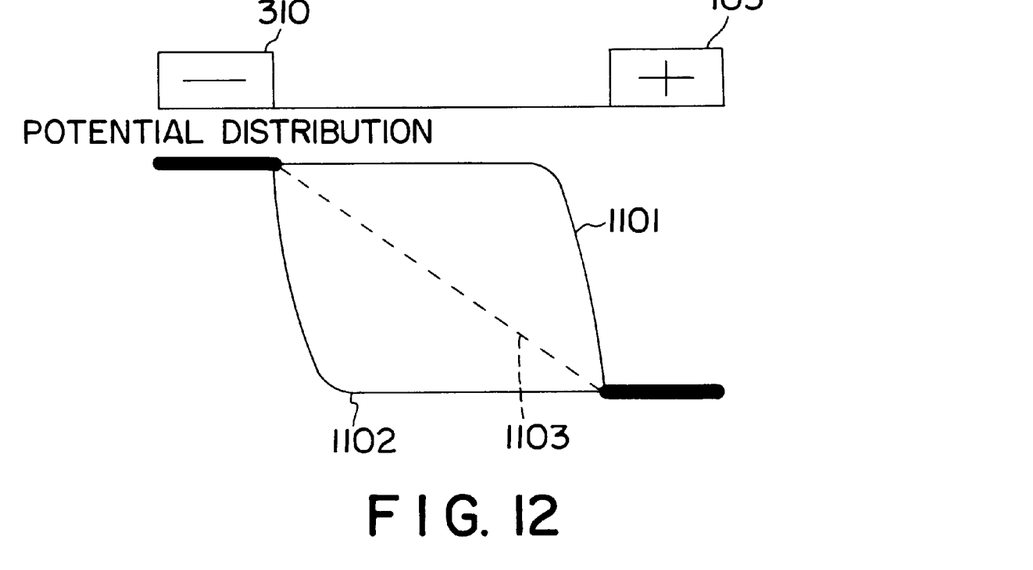
FIG. 12 shows the change in the potential distribution in accordance with an ion migration on a surface.
Figure 13:
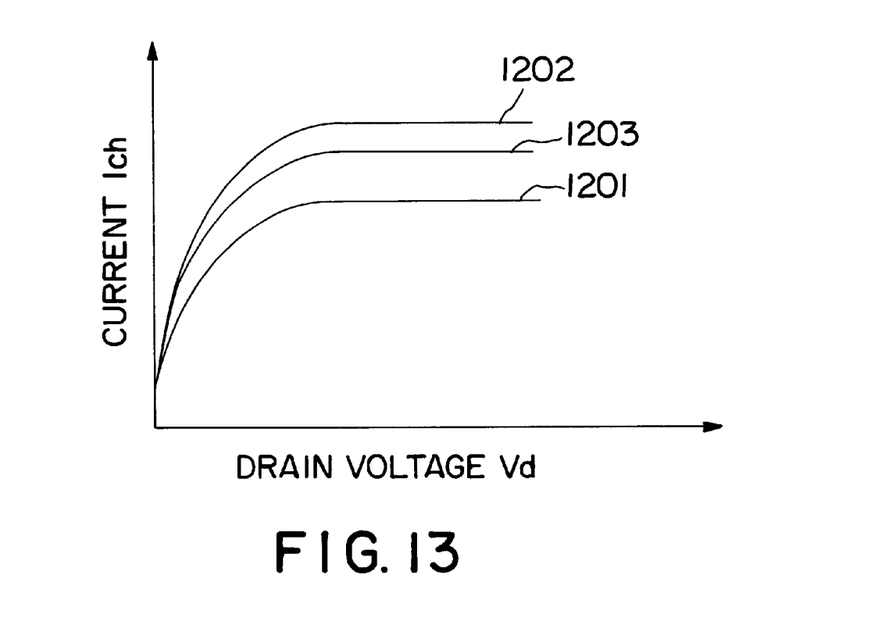
FIG. 13 is a graph showing the change in the current in accordance with an ion charge.

FIG. 11 is a plan view of the semiconductor device according to the third embodiment of the present invention. FIG. 12 shows the change in the potential distribution in accordance with an ion migration on the surface. FIG. 13 is a graph showing the current change in accordance with an ion charge. The same numerals as the numerals in FIG. 7 denote the same elements.

In this embodiment, gate electrode 310 made of the n-type ohmic electrode is formed in stead of gate electrode 210 made of the p-type ohmic electrode in the semiconductor device of the second embodiment shown in FIG. 7.

The method of measuring the ions on the surface when the surface trap is absent or negligible will be described by the use of this embodiment.

The voltage, which is higher than the voltage applied to gate electrode 310, is first applied to gate electrode 105. The potential difference between gate electrodes 105 and 310 is made. In this case, when the ions are absent on the surface of the semiconductor or insulating film 406 formed on the surface of the semiconductor, the potential distribution on the surface of the semiconductor has distribution shape 1103 of FIG. 12.

When a positive ions are present on the surface of the semiconductor or insulating film 406 formed on the surface of the semiconductor, an electric field applied between gate electrodes 105 and 310 allows the positive ion to be shifted to gate electrode 310 in a low bias direction.

When the positive ions reach gate electrode 310, a positive charge is transferred from the positive ion to gate electrode 310. At the same time, the positive charge is injected into the surface from gate electrode 105 opposite to gate electrode 310, so that an electric field concentration is caused near gate electrode 105. Thus, by an injection of the positive charge, the shape of the potential distribution near gate electrode 105 is changed into distribution shape 1101 from distribution shape 1103 as shown in FIG. 12.

When the ions on insulating film 406 are negative ions, the negative ions are shifted to gate electrode 105 in a high bias direction. When the negative ions reach gate electrode 105, a negative charge is transferred from the negative ions to gate electrode 105. At the same time, the negative charge is injected into the surface from gate electrode 310 opposite to gate electrode 105. Thus, the shape of the potential distribution near the surface is changed into distribution shape 1102 from distribution shape 1103 of FIG. 12.

In this embodiment, when both of the positive and negative ions are present, the charges are injected from both of gate electrodes 105, 310. Thus, the difference between the positive ion and the negative ion in existing quantity is measured.

FIG. 13 shows current Ich flowing between source electrode 103 and drain electrode 104 formed on both the ends of conductive layer 102. In the drawing, graph 1203 during the absence of ions is changed into graph 1201 in case of positive ions and into graph 1202 in case of negative ions. That is, a drain voltage Vd is fixed and current Ich flowing between source electrode 103 and drain electrode 104 is then measured, whereby the charge of the ions placed on the surface can be determined.

Although gate electrodes 105, 310 are disposed directly on conductive layer 102 in this embodiment, as shown in FIGS. 8 and 9, the present invention may be applied to the semiconductor device in which the gate electrode is formed through the insulating film such as a dielectric film.

Although conductive layer 102 has been described as the n-type semiconductor in the first through third embodiments, the present invention can be applied to conductive layer 102 of the p-type semiconductor. In this case, source electrode 103 and drain electrode 104 are made of the p-type ohmic electrode. Gate electrode 105 is made of the n-type ohmic electrode or the p-type Schottky electrode.

While preferred embodiments of the present invention have been described using specific terms, such description is for illustrative purposes only, and it is to be understood that changes and variations may be made without departing from the spirit or scope of the following claims.

What is claimed is:

1. A method of evaluating the surface/interface of a semiconductor, in a semiconductor device which comprises:

a semiconductor substrate;

a first conductive-type conductive layer formed on said semiconductor substrate;

a source electrode formed on one end of the surface of said first conductive-type conductive layer and composed of a first conductive-type ohmic electrode;

a drain electrode formed opposite to said source electrode on the other end of the surface of said first conductive-type conductive layer and composed of the first conductive-type ohmic electrode; and a gate electrode formed on at least one end of the surface of said conductive layer on which said source electrode or said drain electrode is not disposed, and composed of a second conductive-type ohmic electrode or a first conductive-type Schottky electrode, said method comprising the steps of:

changing a voltage applied to said gate electrode and measuring a change in a value of a current flowing between said source electrode and said drain electrode in response to the change in the voltage; and determining the type of trap of the surface and an interface between said source electrode and said drain electrode from an amount of change in the value of the current, as a function of said voltage applied to said gate electrode.

2. A method of evaluating the surface/interface of a semiconductor, said semiconductor includes a plurality of semiconductor devices, each said device comprising:

a semiconductor substrate;

a first conductive-type conductive layer formed on said semiconductor substrate;

a source electrode formed on one end of the surface of said first conductive-type conductive layer and composed of a first conductive-type ohmic electrode;

a drain electrode formed opposite to said source electrode on the other end of the surface of said first conductive-type conductive layer and composed of the first conductive-type ohmic electrode; and a gate electrode formed on at least one end of the surface of said conductive layer on which said source electrode or said drain electrode is not disposed, and composed of a second conductive-type ohmic electrode or a first conductive-type Schottky electrode, each said gate electrode having a different width from the end of said gate electrode to the end of the surface opposite said gate electrode, said method comprising the steps of:

choosing a first one of said semiconductor devices that exhibits a potential of the surface/interface trap being equal to that of the gate voltage of said chosen semiconductor device;

choosing a different semiconductor device such that the distance between said electrode and a side surface of the conductive layer opposite thereto is different from said first chosen width, or such that between one gate electrode and another gate electrode opposite thereto is different from said first chosen width;

measuring the change of current flowing between said source electrode and said drain electrode in response to the change in the distance; and measuring a recombination rate at the trap of the surface of the semiconductor or interface in accordance with the size of said distance in which the amount of change in the value of the current is increased.

3. A method of evaluating the surface/interface of a semiconductor, in a semiconductor device which comprises:

a semiconductor substrate;

a first conductive-type conductive layer formed on said semiconductor substrate;

a source electrode formed on one end of the surface of said first conductive-type conductive layer and composed of a first conductive-type ohmic electrode;

a drain electrode formed opposite to said source electrode on the other end of the surface of said first conductive-type conductive layer and composed of the first conductive-type ohmic electrode;

a first gate electrode formed on one end of the surface of said conductive layer on which said source electrode or said drain electrode is not disposed, and composed of a second conductive-type ohmic electrode or a first conductive-type Schottky electrode; and a second gate electrode formed opposite to said first gate electrode on the other end of the surface of said conductive layer on which said source electrode or said drain electrode is not disposed, and composed of the first conductive-type ohmic electrode or a second conductive-type Schottky electrode, said method comprising the steps of:

applying voltages of different potentials to said first gate electrode and said second gate electrode, respectively;

applying a constant voltage to said drain electrode and measuring the value of the current flowing between said drain electrode and said source electrode; and determining a charge of ions placed on the surface of said semiconductor from the value of the current.

* * * * *